(12) United States Patent
Toda et al.

(10) Patent No.: US 12,085,586 B2
(45) Date of Patent: Sep. 10, 2024

(54) PROBE ELEMENT AND PROBE UNIT

(71) Applicant: Murata Manufacturing Co., Ltd., Kyoto-fu (JP)

(72) Inventors: Jun Toda, Nagaokakyo (JP); Kiyoto Araki, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 488 days.

(21) Appl. No.: 17/412,014

(22) Filed: Aug. 25, 2021

(65) Prior Publication Data

US 2021/0382087 A1 Dec. 9, 2021

Related U.S. Application Data

(63) Continuation of application No. PCT/JP2020/006967, filed on Feb. 21, 2020.

(30) Foreign Application Priority Data

Feb. 27, 2019 (JP) ................. 2019-034003

(51) Int. Cl.
*G01R 1/067* (2006.01)
*H01R 24/44* (2011.01)
*H01R 103/00* (2006.01)

(52) U.S. Cl.
CPC ............. *G01R 1/067* (2013.01); *H01R 24/44* (2013.01); *H01R 2103/00* (2013.01); *H01R 2201/20* (2013.01)

(58) Field of Classification Search
CPC ............... G01R 1/067; G01R 1/06722; G01R 1/06772; H01R 24/44; H01R 2103/00;
(Continued)

(56) References Cited

U.S. PATENT DOCUMENTS 6,116,945 A * 9/2000 Davis ................. H01R 13/5825
439/598
6,118,287 A 9/2000 Boll et al.
(Continued)

FOREIGN PATENT DOCUMENTS

JP 2001-307811 A 11/2001
JP 2004-177400 A 6/2004
(Continued)

OTHER PUBLICATIONS

International Search Report issued in PCT/JP2020/006967; mailed Apr. 21, 2020.
(Continued)

*Primary Examiner* — Abdullah A Riyami
*Assistant Examiner* — Nader J Alhawamdeh
(74) *Attorney, Agent, or Firm* — Studebaker & Brackett PC

(57) ABSTRACT

A probe element includes a conduction pin, a cylindrical barrel, and a bushing. The barrel accommodates the conduction pin inside thereof such that the tip portion of the conduction pin is exposed to the outside. The bushing holds the conduction pin inside the barrel in a state in which the tip portion is movable, and has predetermined permittivity. The conduction pin includes a tip portion, an intermediate portion partially accommodating the tip portion, and a cylindrical socket portion coupled to the intermediate portion. A distance between the socket portion and the inner wall surface of the barrel, and a distance between the intermediate portion and the inner wall surface of the barrel in a direction orthogonal to an extending direction of the barrel are different from each other.

18 Claims, 2 Drawing Sheets

(58) Field of Classification Search
CPC ............ H01R 2201/20; H01R 13/2421; H01R 13/6477; H01R 13/17
See application file for complete search history.

(56) References Cited

U.S. PATENT DOCUMENTS

| | | | |
|---|---|---|---|
| 6,734,689 B1* | 5/2004 | Yang .................. | G01R 1/06772 |
| | | | 324/755.05 |
| 9,762,001 B2* | 9/2017 | Morello ................. | H01R 24/40 |
| 10,197,598 B2* | 2/2019 | Yui .................... | G01R 31/2808 |
| 2017/0227579 A1* | 8/2017 | Yui ...................... | G01R 1/0408 |
| 2021/0382087 A1* | 12/2021 | Toda ..................... | H01R 13/17 |

FOREIGN PATENT DOCUMENTS

| | | | |
|---|---|---|---|
| JP | 2008-096293 A | | 4/2008 |
| JP | 2010-025884 A | | 2/2010 |
| JP | 2012099246 A | * | 5/2012 |
| WO | 2018/003640 A1 | | 1/2018 |

OTHER PUBLICATIONS

Written Opinion of the International Searching Authority issued in PCT/JP2020/006967; mailed Apr. 21, 2020.

\* cited by examiner

PROBE ELEMENT AND PROBE UNIT

CROSS-REFERENCE TO RELATED APPLICATIONS

This application claims benefit of priority to International Patent Application No. PCT/JP2020/006967, filed Feb. 21, 2020, and to Japanese Patent Application No. 2019-034003, filed Feb. 27, 2019, the entire contents of each are incorporated herein by reference.

BACKGROUND

Technical Field

The present disclosure relates to a probe element for inspecting a connector having a terminal for a high frequency signal.

Background Art

Japanese Unexamined Patent Application Publication No. 2001-307811 describes a configuration including a pin terminal and a holder as an electrical coupling device. In the electrical coupling device described in Japanese Unexamined Patent Application Publication No. 2001-307811, the pin terminal is arranged in the holder. The pin terminal is held by an insulator arranged in the holder.

SUMMARY

When a high frequency signal is measured with an electrical coupling device having such a configuration, a pin terminal is coupled to a coaxial cable, for example.

At this time, in the case that impedance matching between the pin terminal and the coaxial cable is not sufficient, transmission loss occurs, and the high frequency signal may not be measured with high accuracy. In particular, in the case of a high frequency signal having a short wave length such as a millimeter wave, such an existing configuration may not achieve impedance matching for measuring the high frequency signal with high accuracy.

Accordingly, the present disclosure provides a probe element capable of measuring a high frequency signal with high accuracy.

A probe element according to the present disclosure includes a conduction pin, a cylindrical barrel, and a bushing. The conduction pin has one end to be coupled to a probing object. The cylindrical barrel accommodates the conduction pin inside thereof such that the one end of the conduction pin is exposed to the outside. The bushing holds the conduction pin inside the barrel in a state in which the one end of the conduction pin is movable, and has predetermined permittivity. The conduction pin includes a tip portion including the one end, a cylindrical socket portion arranged at the other end opposite to the one end, and an intermediate portion coupling the tip portion and the socket portion. A distance between the socket portion and the barrel, and a distance between the intermediate portion and the barrel in a direction orthogonal to an extending direction of the barrel are different from each other.

In this configuration, it is possible to suppress a difference between impedance at a portion where the bushing exists between the conduction pin and the barrel, and impedance at a portion where the bushing does not exist between the conduction pin and the barrel.

According to the present disclosure, it is possible to realize a probe element capable of measuring a high frequency signal with high accuracy.

DETAILED DESCRIPTION

A probe element according to an embodiment of the present disclosure will be described with reference to the accompanying drawings. In each of the drawings in the following embodiments, the vertical and horizontal dimensional relationship is appropriately emphasized, and does not necessarily coincide with the vertical and horizontal dimensional relationship in actual dimensions. In order to facilitate reading the drawings, some reference signs are omitted as necessary.

(Configuration of Probe Unit)

Figure 1:
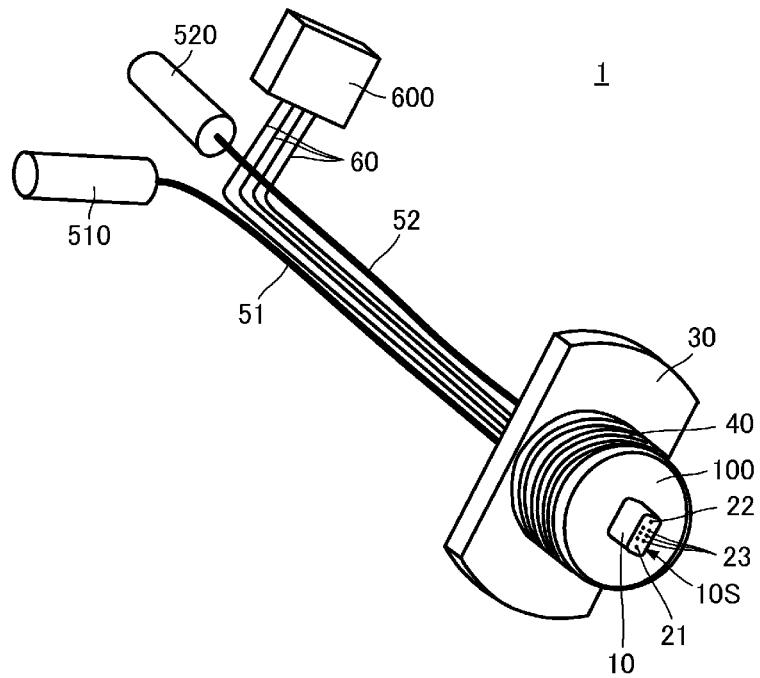
FIG. 1 is a perspective view of a probe unit illustrating the schematic configuration thereof.

FIG. 1 is a perspective view of a probe unit illustrating the schematic configuration thereof. As illustrated in FIG. 1, a probe unit 1 includes a probe holding member 10, a support 100, a flange 30, a spring 40, a coaxial cable 51, a coaxial cable 52, a plurality of signal cables 60, a coaxial connector 510, a coaxial connector 520, and a connector 600. It is sufficient that the probe unit 1 includes at least the coaxial cable 51 among the coaxial cable 51, the coaxial cable 52, and the plurality of signal cables 60.

The probe holding member 10 has a solid shape having an inspection surface 10S. The probe holding member 10 holds a probe element 21, a probe element 22, and a plurality of probe elements 23. The tip (one end) of the probe element 21, the tip (one end) of the probe element 22, and the tips (one ends) of the plurality of probe elements 23 protrude outward from the inspection surface 10S. The probe element 21, the probe element 22, and the plurality of probe elements 23 extend along a direction orthogonal to the inspection surface 10S.

The probe element 21, the probe element 22, and the plurality of probe elements 23 are arranged in a predetermined pattern in the inspection surface 10S. Specifically, the probe element 21 and the probe element 22 are arranged so as to sandwich the plurality of probe elements 23.

The probe element 21 and the probe element 22 are a probe element for measuring a high frequency signal. The probe element 21 and the probe element 22 correspond to the "probe element" of the present disclosure. The plurality of probe elements 23 is a probe element for measuring such as a control signal or a low frequency signal, for example.

The support 100 has a flat plate shape. The support 100 is in contact with the surface of the probe holding member 10 on the side opposite to the inspection surface 10S.

The flange 30 has a flat plate shape. The flange 30 is arranged in the side of the surface of the support 100 opposite to the probe holding member 10 side. The flange 30 and the support 100 are arranged with a predetermined distance therebetween. The spring 40 is arranged between the support 100 and the flange 30.

One end of the coaxial cable 51 is coupled to the probe element 21, and the other end is coupled to the coaxial connector 510. One end of the coaxial cable 52 is coupled to the probe element, and the other end is coupled to the coaxial connector 520. One ends of the plurality of signal cables 60 are coupled to the plurality of probe elements 23, respectively, and the other ends of the plurality of signal cables 60 are coupled to the connector 600.

(Configuration of Probe Element)

Figure 2:
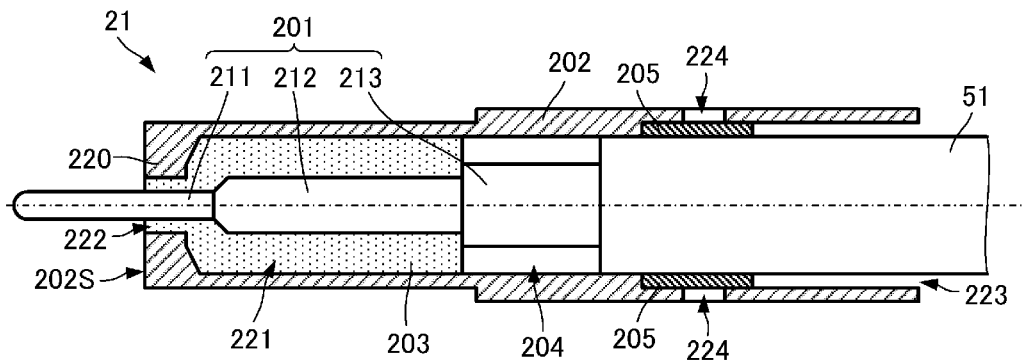
FIG. 2 is a side view of a probe element illustrating the configuration thereof.
Figure 3:
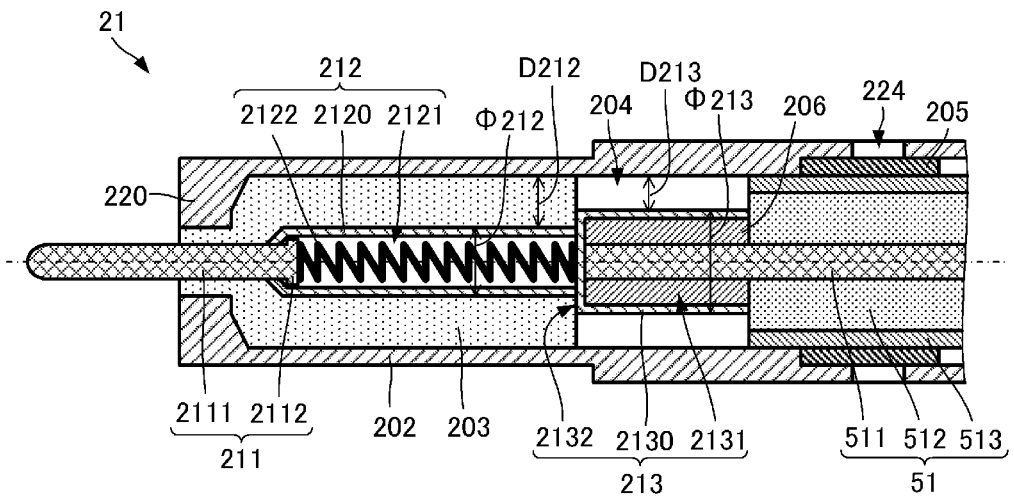
FIG. 3 is a side sectional view of the probe element illustrating the configuration thereof.

FIG. 2 is a side view of a probe element illustrating the configuration thereof. In FIG. 2, a barrel and a bushing are illustrated in a sectional view to facilitate reading the internal configuration. FIG. 3 is a side sectional view of the probe element illustrating the configuration thereof. Since the probe element 21 and the probe element 22 basically have the same shape, the configuration of the probe element 21 will be described below with reference to FIG. 2 and FIG. 3.

As illustrated in FIG. 2 and FIG. 3, the probe element 21 includes a conduction pin 201, a barrel 202, and a bushing 203.

The conduction pin 201 includes a tip portion 211, an intermediate portion 212, and a socket portion 213.

As illustrated in FIG. 3, the tip portion 211 is a conductor and includes a main portion 2111 and an end portion 2112. The main portion 2111 has a rod shape. One end (tip) of the main portion 2111 has a hemispherical shape, and the other end is coupled to the end portion 2112. The end portion 2112 has a disk shape, and the main surface of the end portion 2112 is coupled to the other end of the main portion 2111. The main portion 2111 and the end portion 2112 are integrally formed, for example.

The intermediate portion 212 is a conductor, and includes a housing 2120 having a cylindrical shape and a spring 2122. A part of the tip portion 211 in the extending direction thereof is arranged in a hollow portion 2121 of the housing 2120. More specifically, the hollow portion 2121 includes the end portion 2112 of the tip portion 211, and a part of the main portion 2111 is arranged in the hollow portion 2121. Further, the spring 2122 is arranged in the hollow portion 2121. One end of the spring 2122 is in contact with the end portion 2112. The other end of the spring 2122 is in contact with a bottom wall 2132 of the socket portion 213.

The socket portion 213 is a conductor and has a cylindrical shape. More specifically, the socket portion 213 includes a cylindrical side wall 2130 and the bottom wall 2132. The bottom wall 2132 is coupled to the housing 2120 of the intermediate portion 212 and closes one end of the hollow portion 2121. An inner conductor 511 of the coaxial cable 51 is accommodated in a recess 2131 surrounded by the side wall 2130 and the bottom wall 2132 of the socket portion 213. The inner conductor 511 is joined to the socket portion 213 by a conductive bonding material 206. An insulator 512 and an outer conductor 513 of the coaxial cable 51 are arranged outside the recess 2131 of the socket portion 213.

The socket portion 213 and the intermediate portion 212 may be integrally formed, or may be configured of separate members joined together.

In the case of being integrally formed, the socket portion 213 and the intermediate portion 212 may be formed as follows, for example. The housing 2120 of the intermediate portion 212 and a portion, having a diameter larger than that of the housing 2120 in the bottom wall 2132, of the socket portion 213 are integrally formed. Next, the conduction pin 201 and the spring 2122 are inserted into the intermediate portion 212. Next, the hole of the bottom wall 2132 of the socket portion 213 is closed by such as a disk-shaped member.

In the case of being configured of separate members, the socket portion 213 and the intermediate portion 212 may be formed as follows, for example. The conduction pin 201 and the spring 2122 are inserted into the housing 2120 of the intermediate portion. The socket portion 213 is joined to the other end (end portion on the side where the conduction pin 201 does not protrude) of the housing 2120. With this, the other end of the hollow portion 2121 of the intermediate portion 212 is closed by the bottom wall 2132 of the socket portion 213.

The barrel 202 is a conductor and has a cylindrical shape. The inner diameter of the barrel 202 is constant regardless of the position in the extending direction of the barrel 202. Here, constant of the above includes a range of manufacturing errors and shape measurement errors. Note that in this description and the like, the inner diameter refers to the length of the inner peripheral portion, and the shape of the inner peripheral portion is not limited to a circular shape and includes an elliptical shape and a rectangular shape.

The barrel 202 has a wall 220 at one end in the extending direction (parallel to the axial direction). The wall 220 has a hole 222 to make an internal space 221 of the barrel 202 communicate with the outside. The diameter of the hole 222 has a dimension to allow the tip portion 211 to pass through, and is preferably as small as possible. The other end of the barrel in the axial direction has an opening 223 communicating with the outside. The barrel 202 has a through-hole 224 at a position in the side of the opening 223 in the axial direction (extending direction of the barrel 202). The through-hole 224 penetrates through the wall of the barrel 202 in a direction orthogonal to the extending direction of the barrel 202.

The conduction pin 201 is arranged in the internal space 221 of the barrel 202. The tip portion 211, the intermediate portion 212, and the socket portion 213 of the conduction pin 201 are arranged in the direction parallel to the extending direction of the barrel 202.

The tip portion 211 of the conduction pin 201 penetrates through the hole 222. A part of the tip portion 211 of the conduction pin 201 protrudes outward from a one end surface 202S of the barrel 202.

The bushing 203 has an insulation property and predetermined permittivity. The permittivity of the bushing 203 is higher than the permittivity of air. In this case, the bushing 203 serves as a first dielectric of the present disclosure, and air serves as a second dielectric of the present disclosure. The permittivity of the first dielectric of the present disclosure is higher than the permittivity of the second dielectric of the present disclosure. The bushing 203 fixes the conduction pin 201 to the internal space 221 of the barrel 202. More specifically, the bushing 203 is arranged between the intermediate portion 212 of the conduction pin 201 and the inner wall of the barrel 202 in the extending direction of the barrel 202. The bushing 203 is in contact with the intermediate portion 212 of the conduction pin 201 and the inner wall of the barrel 202. The bushing 203 is also in contact with the inner surface of the wall 220 of the barrel 202. With this, the conduction pin 201 is fixed to the barrel 202.

The bushing 203 is not arranged between the socket portion 213 of the conduction pin 201 and the inner wall of the barrel 202 in the extending direction of the barrel 202. That is, in the extending direction of the barrel 202, there is a hollow space 204 between the socket portion 213 of the conduction pin 201 and the inner wall of the barrel 202.

The bushing 203 is arranged between the tip portion 211 of the conduction pin 201 and the inner wall of the barrel 202. The bushing 203 is arranged in a state in which the tip portion 211 is movable in the axial direction.

The coaxial cable 51 is inserted from the opening 223 of the barrel 202. The tip of the insulator 512 of the coaxial cable 51 is in contact with or close to the socket portion 213. The outer conductor 513 of the coaxial cable 51 is joined to the barrel 202 by a conductive bonding material 205.

In the configuration above, the diameter Φ212 of the intermediate portion 212 is smaller than the diameter Φ213 of the socket portion 213. In other words, in the direction orthogonal to the extending direction of the barrel 202, the outer diameter of the intermediate portion 212 is smaller than the outer diameter of the socket portion 213. Note that in this description and the like, the outer diameter refers to the length of the outer peripheral portion, and the shape of the outer peripheral portion is not limited to a circular shape and includes an elliptical shape and a rectangular shape.

With this configuration, a distance D212 between the intermediate portion 212 and the barrel 202 in the direction orthogonal to the extending direction of the barrel 202 is longer than a distance D213 between the socket portion 213 and the barrel 202. The distance D212 and the distance D213 mentioned here are average values of distances measured at a plurality of points in the extending direction of the intermediate portion 212, the socket portion 213, and the barrel 202, for example.

Since the bushing 203 has permittivity higher than that of air, making the distance D212 longer than the distance D213 may reduce the difference between the capacitance of the intermediate portion 212 and the barrel 202, and the capacitance of the socket portion 213 and the barrel 202. As described above, the probe element 21 uses the bushing 203 for fixing the conduction pin 201 to the barrel 202, and for impedance matching in the extending direction of the conduction pin 201.

With this, the difference between the impedance of the transmission line portion including the intermediate portion 212 and the impedance of the transmission line portion including the socket portion 213 may be reduced, and the impedance matching may be achieved. As the result, the probe element 21 may transmit a high frequency signal with low loss, and the probe unit 1 including the probe element 21 may measure a high frequency signal with high accuracy.

In particular, in the case of a high frequency signal having a higher frequency such as a millimeter wave, impedance mismatching occurs in the conduction pin due to a change in shape in the extending direction and a change in constituent members of the conduction pin. However, as achieved in the probe element 21, impedance matching may be achieved by appropriately differentiating the shape of the socket portion 213 which is a portion to be coupled to the coaxial cable 51 and the shape of the intermediate portion 212 which is a portion for holding the tip portion 211.

Figure 4:
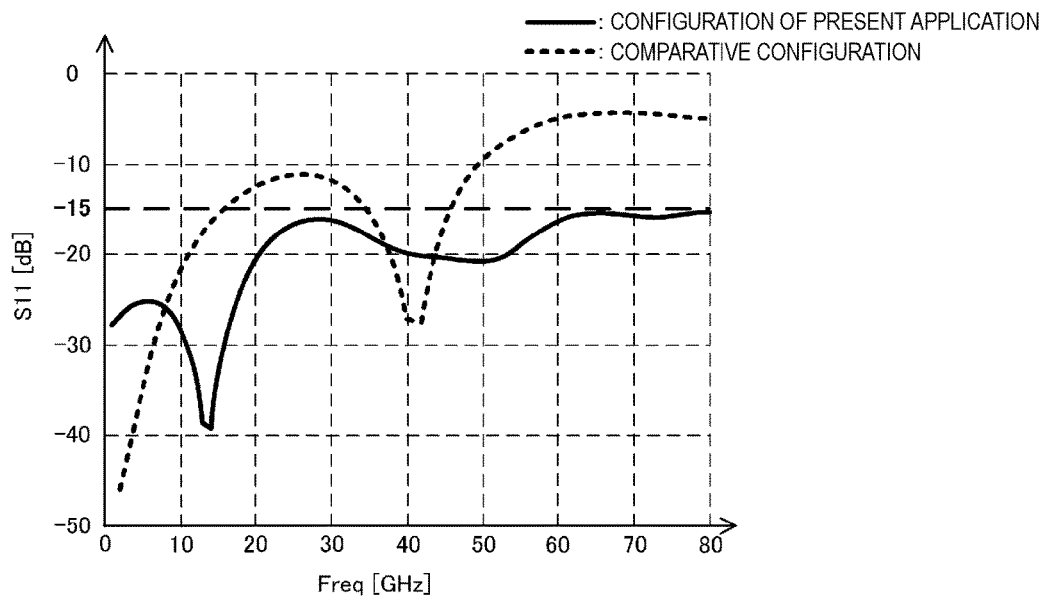
FIG. 4 is a graph showing transmission characteristics of the probe element.

FIG. 4 is a graph showing the transmission characteristics of the probe element. As shown in FIG. 4, with the configuration of the present disclosure, the return loss may be reduced over substantially the entire frequency band up to 80 [GHz]. In particular, with the configuration of the present disclosure, the return loss is suppressed to less than a certain level (here, −15 [dB]) at a frequency higher than approximately 25 [GHz].

Further, in the configuration of the present embodiment, the diameter of the recess 2131 of the socket portion 213 is larger than the diameter of the hollow portion 2121 of the intermediate portion 212. With this, the diameter of the inner conductor 511 of the coaxial cable 51 may be increased, and the resistance loss in the coaxial cable 51 may be reduced. The measurement sensitivity of the probe unit 1, therefore, is improved.

Further, the bushing 203 is arranged between the intermediate portion 212 and the barrel 202 in this configuration. With this, it is possible to further suppress that the conduction pin 201 comes off from the barrel 202. In addition, it is possible to suppress that the tip of the conduction pin 201 moves in a direction perpendicular to the extending direction of the barrel 202.

(Derivative Example of Probe Element)

Figure 5:
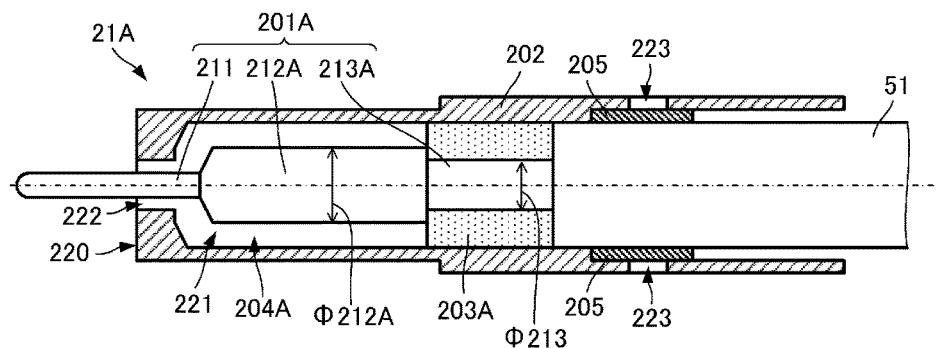
FIG. 5 is a side view of a derivative of the probe element illustrating the configuration thereof.

FIG. 5 is a side view of a derivative of the probe element illustrating the configuration thereof. As illustrated in FIG. 5, a probe element 21A is different from the probe element 21 in that a bushing 203A is arranged between a socket portion 213A and the barrel 202. The basic configuration of the probe element 21A is the same as that of the probe element 21, and thus, the description of the same portions is omitted.

A conduction pin 201A includes the tip portion 211, an intermediate portion 212A, and the socket portion 213A.

In the probe element 21A, the bushing 203A is arranged between the socket portion 213A and the barrel 202. The bushing 203A is not arranged between the intermediate portion 212A and the barrel 202. That is, a hollow space 204A is formed between the intermediate portion 212A and the barrel 202. In this case, air serves as the first dielectric of the present disclosure and the bushing 203 serves as the second dielectric of the present disclosure, and the permittivity of the first dielectric of the present disclosure is lower than the permittivity of the second dielectric of the present disclosure.

The diameter Φ3213 of the socket portion 213A is smaller than the diameter Φ212A of the intermediate portion 212A. With the relationship above, the probe element 21A may achieve impedance matching in the same manner as the probe element 21.

Further, in the configuration above, the bushing 203A is arranged between the socket portion 213A and the barrel 202. In this case, the elasticity of the conduction pin 201 may be increased, and the contact pressure of the probe element 21A may be increased.

Note that, in each of the above-described embodiments, it is more preferable that the impedance matching member is arranged in contact with or close to the joint portion between the socket portion and the coaxial cable in the probe element. With this, the impedance of the conduction pin and the impedance of the coaxial cable are more reliably matched.

Figure 6:
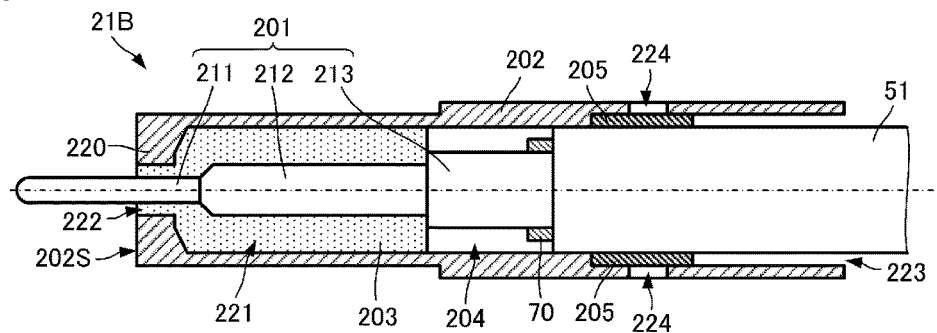
FIG. 6 is a side view of a derivative of the probe element illustrating the configuration thereof.

Further, a structure illustrated in FIG. 6 may be used. FIG. 6 is a side view of a derivative of the probe element illustrating the configuration thereof. As illustrated in FIG. 6, a probe element 21B is different from the probe element 21 in that an impedance adjustment member 70 is further provided. The configuration of other portions of the probe element 21B is the same as that of the probe element 21, and thus, the description of the same portions is omitted.

The impedance adjustment member 70 is made of a dielectric or a conductor. The impedance adjustment member 70 is arranged in contact with or close to the boundary between the socket portion 213 and the coaxial cable 51. The impedance adjustment member 70 has a ring shape surrounding at least a part of the circumferential surface of the socket portion 213, for example.

In a case that the impedance adjustment member 70 is a conductor, the socket portion 213 and the impedance adjustment member 70 are regarded as one conductive member. The outer diameter of the first portion of the conductive member where the impedance adjustment member 70 is not arranged and the outer diameter of the second portion of the conductive member where the impedance adjustment member 70 is arranged may be made different from each other. This may suppress a rapid change in impedance in the extending direction of the conduction pin 201.

Further, in a case that the impedance adjustment member 70 is a dielectric, it is possible to suppress a rapid change in permittivity in the extending direction of the conduction pin 201. This may suppress a rapid change in impedance in the extending direction of the conduction pin 201.

The impedance adjustment member 70 may be disposed in contact with or close to the boundary between the intermediate portion 212 and the socket portion 213.

In the above-described embodiments, the diameter of the inner wall surface of the barrel 202 is the same at any position in the extending direction. However, by adjusting the diameter of the inner wall surface of the barrel 202, the distance between the intermediate portion and the inner wall surface of the barrel and the distance between the socket portion and the inner wall surface of the barrel may be adjusted. Even in the configuration above, the probe element may achieve impedance matching in the extending direction of the conduction pin.

Further, in the probe element, adjustment of the diameter of the intermediate portion and the socket portion, and adjustment of the diameter of the inner wall surface of the barrel may be performed.

What is claimed is:

1. A probe element, comprising:
a conduction pin having one end configured to couple to a probing object, the conduction pin including
a tip portion including the one end,
a cylindrical socket portion arranged at another end opposite to the one end, and
an intermediate portion coupling the tip portion and the socket portion;
a cylindrical barrel accommodating the conduction pin inside thereof such that the one end is exposed to an outside of the barrel;
a bushing holding the conduction pin inside the barrel in a state in which the one end is movable, and having predetermined permittivity; and
an impedance matching member adjacent to an opposite side of the socket portion from the intermediate portion,
wherein a distance between the socket portion and the barrel and a distance between the intermediate portion and the barrel in a direction orthogonal to an extending direction of the barrel are different from each other.

2. The probe element according to claim 1, wherein the barrel has an inner diameter which is constant in the extending direction, and
an outer diameter of the socket portion and an outer diameter of the intermediate portion in the direction orthogonal to the extending direction of the barrel are different from each other.

3. The probe element according to claim 2, wherein the bushing is arranged between the intermediate portion and the barrel, and is absent from between the socket portion and the barrel, and
the outer diameter of the socket portion is larger than the outer diameter of the intermediate portion.

4. The probe element according to claim 1, wherein the intermediate portion and the socket portion are integrally formed.

5. A probe unit, comprising:
the probe element according to claim 1;
a coaxial cable coupled to the socket portion of the probe element; and
a probe holding member configured to hold the probe element.

6. The probe element according to claim 2, wherein the intermediate portion and the socket portion are integrally formed.

7. A probe element, comprising:
a conduction pin having one end configured to couple to a probing object, the conduction pin including
a tip portion including the one end,
a cylindrical socket portion arranged at another end opposite to the one end, and
an intermediate portion coupling the tip portion and the socket portion;
a cylindrical barrel accommodating the conduction pin inside thereof such that the one end is exposed to an outside of the barrel; and
a first dielectric positioned between the barrel and the socket portion and a second dielectric positioned between the barrel and the intermediate portion in a direction orthogonal to an extending direction of the barrel,
wherein permittivity of the first dielectric and permittivity of the second dielectric are different from each other.

8. The probe element according to claim 7, wherein the permittivity of the first dielectric is larger than the permittivity of the second dielectric, and
a distance between the socket portion and the barrel is larger than a distance between the intermediate portion and the barrel in the direction orthogonal to the extending direction of the barrel.

9. The probe element according to claim 8, wherein the barrel has an inner diameter which is constant in the extending direction, and
an outer diameter of the socket portion is smaller than an outer diameter of the intermediate portion in the direction orthogonal to the extending direction of the barrel.

10. The probe element according to claim 7, wherein the second dielectric is air.

11. The probe element according to claim 7, wherein the permittivity of the first dielectric is smaller than the permittivity of the second dielectric, and
a distance between the socket portion and the barrel is smaller than a distance between the intermediate portion and the barrel in the direction orthogonal to the extending direction of the barrel.

12. The probe element according to claim 11, wherein the barrel has an inner diameter which is constant in the extending direction, and
an outer diameter of the socket portion is larger than an outer diameter of the intermediate portion in the direction orthogonal to the extending direction of the barrel.

13. The probe element according to claim 7, wherein the first dielectric is air.

14. The probe element according to claim 7, wherein the intermediate portion and the socket portion are integrally formed.

15. The probe element according to claim 7, further comprising:
   an impedance matching member adjacent to an opposite side of the socket portion from the intermediate portion.

16. A probe unit, comprising:
   the probe element according to claim 7;
   a coaxial cable coupled to the socket portion of the probe element; and
   a probe holding member holding the probe element.

17. The probe element according to claim 8, wherein the second dielectric is air.

18. The probe element according to claim 11, wherein the first dielectric is air.

* * * * *